United States Patent [19]

Hiraki et al.

[11] Patent Number: 4,767,517
[45] Date of Patent: Aug. 30, 1988

[54] PROCESS OF DEPOSITING DIAMOND-LIKE THIN FILM BY CATHODE SPUTTERING

[75] Inventors: Akio Hiraki, Nishinomiya; Tatsuro Miyasato, Toyonaka, both of Japan

[73] Assignee: Kabushiki Kaisha Meidensha, Tokyo, Japan

[21] Appl. No.: 20,226

[22] Filed: Mar. 2, 1987

Related U.S. Application Data

[63] Continuation of Ser. No. 675,417, Nov. 27, 1984, abandoned.

[30] Foreign Application Priority Data

Nov. 28, 1983 [JP] Japan ............................. 58-222218
Jun. 19, 1984 [JP] Japan ............................. 59-124392

[51] Int. Cl.⁴ .......................................... C23C 14/34
[52] U.S. Cl. ........................ 204/192.25; 204/192.15
[58] Field of Search .................. 204/192.12, 192.15, 204/192.22, 192.14, 192.16, 192.25; 423/445, 446

[56] References Cited

U.S. PATENT DOCUMENTS

| | | | |
|---|---|---|---|
| 3,317,354 | 5/1967 | Darrow et al. | 423/446 X |
| 3,361,659 | 1/1968 | Bertelsen | 204/192 SP |
| 3,840,451 | 10/1974 | Golyamov et al. | 204/192 C |
| 3,961,103 | 6/1976 | Aisenberg | 423/446 X |
| 4,395,323 | 7/1983 | Denton et al. | 204/192 SP |
| 4,437,962 | 3/1984 | Banks | 204/192 C |
| 4,504,519 | 3/1985 | Zelez | 423/446 X |

FOREIGN PATENT DOCUMENTS 2069008 8/1981 United Kingdom ............ 204/192 C

OTHER PUBLICATIONS

Aisenberg, S. and Chabot, R., "Ion-Beam Deposition of Thin Films of Diamondlike Carbon", Journal of Applied Physics, vol. 42, No. 7, Jun. 1971, pp. 2953-2958.
Spencer, E., et al., "Ion-Beam-Deposited Polycrystalline Diamondlike Films", Applied Physics, vol. 29, No. 2 Jul. 1976, pp. 118-120.

Primary Examiner—John F. Niebling
Assistant Examiner—Nam X. Nguyen
Attorney, Agent, or Firm—Fleit, Jacobson, Cohn & Price

[57] ABSTRACT

The present invention relates to a diamond-like thin film and a method of making the diamond-like thin film comprises causing sputtering by applying an electric power under a limited hydrogen pressure within a sputtering apparatus having a graphite target and forming on a substrate the diamond-like thin film composed an accumulation of particles of several nm to several 100 nm and having its surface enclosed with alkyl radicals whose carbon number is 3 or less and its interior provided with a diamond structure of a four coordinated carbon arrangement.

8 Claims, 2 Drawing Sheets

PROCESS OF DEPOSITING DIAMOND-LIKE THIN FILM BY CATHODE SPUTTERING

This application is a continuation of application Ser. No. 675,417 filed Nov. 27, 1984, now abandoned.

Technical Field

The present invention relates to a diamond-like thin film and method for making the same, and more particularly it relates to a diamond-like thin film consisting of an accumulation of particles which has its surface enclosed with alkyl radicals whose carbon number 3 or less and its interior provided with a diamond structure of a four coordinated carbon arrangement and a method for making the same.

BACKGROUND OF THE INVENTION

Diamond is the hardest substance among the solid substances existing on the earth, electrically constitutes an insulating material whose heat conduction rate is highest at 30° to 650° C. (e.g., about five times that of copper), and is optically excellent in light transmission over a wide range extending from the ultraviolet region to the infrared region except a part of the infrared region.

Also, it is known that the doping of specific impurities causes the diamond to exhibit semi-conductor characteristics.

Due to such excellent properties useful in the many field of applications, the diamond is used as diamond paste, cutter, etc., by utilizing its hardness, for example. However, from the practical point of view the diamond has not been used in the technical field of electronic devices due to the fact that its synthetic method solely has recourse to the high-pressure process thus making it impossible to produce thin plate shaped diamond.

However, owing to the fact that the diamond has a wide band gap, if it is possible to produce a thin diamond film of the p-type or n-type semi-conductor by the doping of the proper impurities, they may be used as thermally stable materials, more particularly as materials suitable, for example, for the window member of solar cells and a high temperature operating semi-conductor in place of the existing semiconductor devices mainly composed of Si, GaAs and other materials which are limited in operating temperature. Moreover, the thin diamond film is expected as the most promising material for the passivation film of GaAs which is presently looked for earnestly.

In order to provide materials which meet these needs, various production methods of the artificial diamond-like thin film from the vapor phase have recently been studied and all of these method employing CVD methods (chemical vapor deposition method) have been said to be capable of producing the thin film by the plasma arc decomposition of a raw gas consisting of a mixed gas of a hydrocarbon such as methane or ethane and hydrogen or by the thermal decomposition of such raw gas on a tungsten filament heated to about 2000° C. or over.

However, these methods involve extremely difficult factors from the standpoints of conditions, efficiency, etc., and also the industrialization of these methods, setting aside their use on a laboratory scale, is difficult in consideration of the cost and other factors.

SUMMARY OF THE INVENTION

The present invention has been made as the consequence of various studies and investigations made for the purpose of efficient production of diamond-like thin films under the above-mentioned circumstances and the invention relates to a method of making a diamond-like thin film and the diamond-like thin film itself, the method comprises the steps of applying electric power to effect the sputtering under a limited hydrogen pressure within a sputtering apparatus containing a graphite target and forming on a substrate a diamond-like thin film composed of an accumulation of particles of several nm to several 100 nm and having its surface enclosed with alkyl radicals whose carbon number is 3 or less and its interior provided with a diamond structure of a four coordinated carbon arrangement, thereby making the diamond-like thin film inexpensive and stable.

DETAILED DESCRIPTION OF THE INVENTION

The present invention has been completed on the basis of a discovery, resulting from various studies and investigations made in view of the foregoing circumstances, that it is possible to produce a diamond-like thin film by the use of sputtering techniques.

As the result of various trials made continuously, it has been confirmed that if, for example, a high frequency power, 13.56 MHz, plate voltage of the power tube of 2 kV, plate current of 0.35A, is used to produce a hydrogen plasma in a planar-type magnetron sputtering apparatus having a hydrogen atmosphere of 66.65 Pa(0.5 Torr) and a graphite target is struck with the thus excited hydrogen and hydrogen ion or radicals, diamond-like particles are deposited on a substrate disposed within the apparatus and a diamond-like thin film is formed and includes alkyl radicals having the carbon number of 3 or less and bonded to the surface of diamond structure of a four coordinated carbon arrangement.

With this process of the diamond-like thin film formation, it has been believed that when, for example, the excited hydrogen and hydrogen ion impinge the graphite, plasma seeds comprising half-bonded carbons and hydrogens are produced and are deposited on the substrate thereby forming a diamond-like thin film having a particular structure as mentioned previously. Then, further studies and investigations have resulted in a discovery that by applying a dc voltage in place of the application of a high frequency power during the sputtering process, it is also possible to form a diamond-like thin film.

More specifically, it has been confirmed that if, for example, a hydrogen plasma is produced by a dc power of 1 kV with current of 0.2A in a sputtering apparatus having a hydrogen atmosphere which is maintained at 1.333 Pa(0.01 Torr) and the thus excited hydrogen and hydrogen ion are caused to impinge on a graphite target, a diamond-like thin film is formed on a substrate in the like manner as mentioned previously.

An examination of the infrared absorption spectra of the diamond-like thin film obtained by this method has shown that the film has the similar structure as in the previously mentioned case, that is, it includes alkyl radicals but it is not an organic high polymer and the carbon number of the alkyl radicals is 3 or less.

Figure 1:
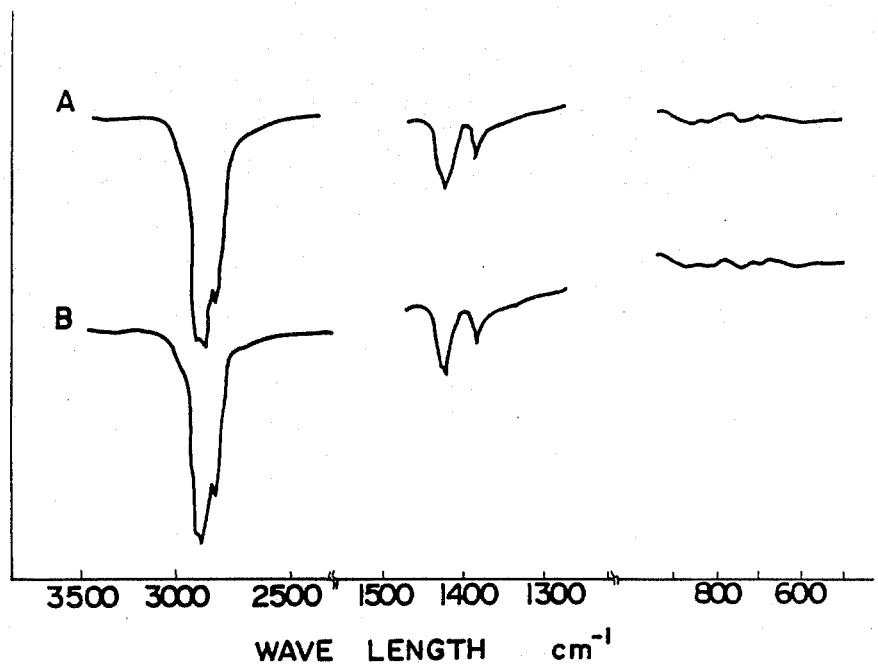
FIG. 1 is a graph showing infrared absorption spectra.

The infrared absorption spectra of the thin film provided by the present invention are shown in FIG. 1 and these spectra will now be described. With the behavior of FIG. 1, the spectrum after the sputtering is represented by A and the spectrum after the annealing is represented by B.

An analysis of these spectra has shown that this film includes alkyl radicals but is not an organic high polymer film, that the carbon number of the alkyl radicals is 3 or less and that the film is not corroded by organic solvents and inorganic acids.

An examination of the film subjected to an annealing treatment at 800° C. for 1 hour has shown that while a part of the hydrogens bonded to the surface and having weak bonding is eliminated, no essential change is observed in those portions forming the diamond structure.

On the other hand, from the result of an elemental analysis it has been confirmed that the film includes only carbon, hydrogen and a trace amount of nitrogen.

Also, as regards the behavior with respect to light transmission properties, the film shows the excellent light transmission properties except that it has an absorption band at 225 nm and it also shows an absorption at around 400 nm in the infrared region. On the other hand, the observation by a transmission electron microscope has confirmed the presence of diamond-particles of 4 to 7 nm and an electron diffraction pattern has shown a ring pattern of a diamond polycrystal as shown in a reference photograph 1. Also, it has been found by the observation of a scanning electron microscope (resolution of 10 nm) that the surface of the thin film has such a marvellous smoothness that no structure is seen in the surface.

It is to be noted that this thin film is judged as a type IIb semiconductive diamond due to the inclusion of nitrogen and the photoluminescence by ultraviolet rays, and one having no nitrogen inclusion forms a colorless and transparent film which is considered to be an insulator.

As described hereinabove, the diamond-like thin film produced in accordance with the invention is quite unique in terms of the simplicity of its production method, the low fabrication temperature, the film morphology (smoothness), etc., over that by the conventionally used CVD methods and also the doping can be effected easily thus making a great contribution to the application of diamond-like thin films to electronic devices.

The present invention will now be described further by way of its embodiments.

Example 1

Figure 2:
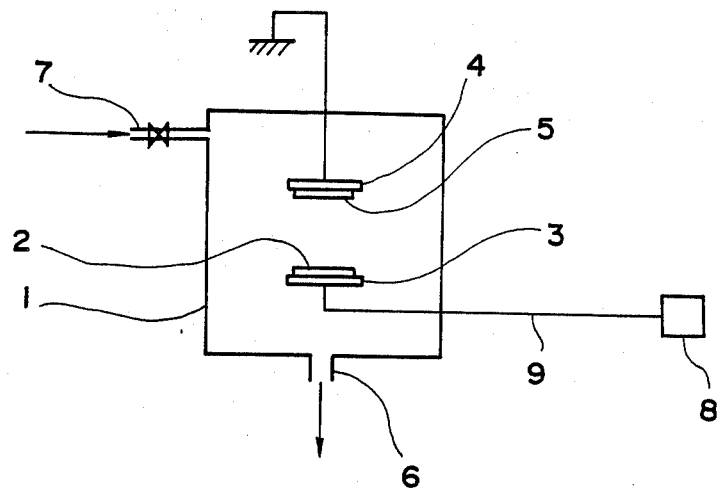
FIG. 2 is a schematic sectional view a sputtering apparatus.

A graphite disk target 2 of 75 mm$\phi$ mounted on a metal supporter electrode 3 was used in a vacuum chamber 1 of a sputtering apparatus (e.g., planar-magnetron type sputter) whose schematic sectional view was shown in FIG. 2 and a distance of the opposite electrodes 3 and 4 was selected about 45 mm. Silicon, glass or aluminum was used as a substrate material 5 and it was mounted on a counter electrode 4. After the vacuum chamber was preliminarily evacuated to produce a vacuum of 13.33 $\mu$Pa ($1 \times 10^{-7}$ Torr) by a vacuum pump which was not shown through an exhaust pipe 6, a hydrogen gas of 99.999 volume percent pure was introduced through an atmosphere gas inlet pipe 7 and was maintained at 13.33 Pa (0.1 Torr).

A high frequency power of 13.56 MHz with a plate voltage of the power tube of 2 kV was supplied from a power source 8 through a high frequency cable 9 and the sputtering was effected for 2 hours using a plate current of 0.4A representing a current density of 9.05 mA/cm$^2$ for the 75 mm $\phi$ target 2. During the sputtering period, the substrate temperature was controlled to prevent it from exceeding 100° C.

When the process was completed, a transparent film having a thickness of about 3 $\mu$m which film is an accumulation of a particle having about 5 nm to 400 nm in diameter and slightly brownish color was formed on the substrate.

This film had a wide range of light transmission characteristics and its absorption end was in the portion of 225 nm. By an infrared absorption spectrum as shown in FIG. 1 it was confirmed that the film was a carbon film containing alkyl radicals of 3 or less in carbon number and it was also confirmed by an electron diffraction pattern that the film was one containing a diamond structure.

However, it was confirmed that those films which were deposited on the remote portions (the upper, lower and side portions of the vacuum chamber inner walls) from the plasma between the sputtering electrodes were mixtures of amorphous carbon and hydrocarbon.

When the high frequency power was decreased, an organic-like film was formed on the substrate. While this film undergone no change when subjected to a heat treatment at 300° C., when the film was heated to higher temperatures, it was decomposed and was carbonized at 600° C. Also, when the substrate was cooled with a liquid nitrogen, a large quantity of tar-like liquid material (black colored) was formed on the substrate. This material was a flammable oligomer.

On the other hand, when the planar magnetron attached to the back of the target was removed and the sputtering was effected under the similar conditions as previously the similar film was obtained, although the rate of film formation was decreased.

EXAMPLE 2

The same procedure of the Example 1 was repeated except that the pressure of vacuum after the introduction of hydrogen into the vacuum chamber was held at 66.65 Pa (0.5 Torr) and the sputtering plate current of 0.35 A was used.

A transparent film having a thickness of about 2 $\mu$m and slightly brownish color was formed on the substrate. As regards the physical properties and behavior of this film, it showed the same behavior as the Example 1.

EXAMPLE 3

The same procedure as the Example 1 was repeated except that the pressure of vacuum after the introduction of hydrogen was maintained at 133.3 Pa (1.0 Torr) and that the plate current of 0.3A was used. A transparent film having a thickness of about 1 $\mu$m and slightly brownish color was formed and its physical properties showed the same behavior as the Example 1.

Under the above conditions, the hydrogen gas pressure was high so that a large amount of white loose particles were formed on the vessel walls (where the electric field was weak). These particles were flammable and had a hydrogen content of 57 atomic %, carbon content of about 43 atomic % and nitrogen content of 0.3 atomic %.

EXAMPLE 4

The Example 1 was repeated except that hydrogen 99.999 volume % and argon of 99.999 volume % were introduced with a volume ratio of 1:1 in place of the hydrogen introduced into the vacuum chamber and then the pressure of vacuum was held at 66.65 Pa (0.5 Torr).

In this case, a transparent film having a film thickness of about 3 μm and slightly colored was formed and its physical properties were the same as the Example 1.

EXAMPLE 5

The Example 1 was repeated except that after the introduction of hydrogen into the vacuum chamber the pressure of vacuum was maintained at 66.65 Pa (0.5 Torr) and that of the sputtering conditions the temperature was changed to 800° C. As a result, a slightly brownish transparent film had a thickness of about 1 μm and its physical properties were practically the same as those obtained in the Example 1.

EXAMPLE 6

The film obtained in the Example 2 was subjected to a heat treatment at 800° C. for 1 hour in a vacuum of 133.3 Pa ($10^{-6}$ Torr) and the various properties were compared with the result that while there were no variations in the light transmission properties and infrared absorption spectrum, the observation of the surface conditions through a scanning electron microscope resulted in the confirmation of the presence of a large number of particles as will be seen from a reference photograph 2(A: before annealing, B: after annealing).

EXAMPLE 7

The Example 2 was repeated in a condition where a stainless steel mesh screen was placed between the target and the substrate in the apparatus shown in FIG. 2 and a dc bias voltage of 200 V was applied.

The surface conditions of the film formed in this way showed a uniform film condition as compared with the case where no bias voltage was applied.

EXAMPLE 8

Figure 3:
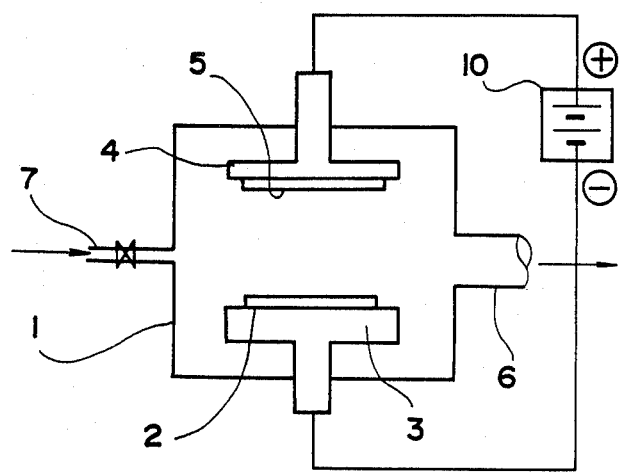
FIG. 3 is a schematic sectional view of a sputtering apparatus used with another embodiment.

Al substrate material 5 of Si, glass, A or TiO was mounted on the counter electrode 4 in the sputtering apparatus shown in FIG. 3. After a vacuum of 13.33 Pa ($1 \times 10^{-7}$ Torr) was preliminarily produced in the vacuum chamber 1, a hydrogen gas of 99.999 volume % pure was introduced through the atmosphere gas inlet pipe 7 and was maintained at 1.333 Pa (0.01 Torr). A dc voltage of 1 kV was supplied from the power source 10 and the sputtering was effected for 2 hours with the resulting current of 0.2 A representing a current density of 4.52 mA/cm² for the 75 mm φ target 2. During the sputtering period, the substrate temperature was controlled to prevent it from exceeding 100° C. After the completion of the process, the presence of a transparent film on the substrate was confirmed and this film had a wide range of light transmission characteristics and an absorption limit of about 225 nm. It was confirmed by an infrared absorptin spectrum that this film was a carbon film containing alkyl radicals whose carbon number was 3 or less and it was confirmed by an X-ray diffraction that it was a film containing the diamond structure and its film structure was similar to those of the Example 1.

Example 9

The same procedure of the Example 8 was repeated except that after the introduction of hydrogen into the vacuum chamber the pressure of vacuum was maintained at 13.33 Pa(0.1 Torr) and the sputtering voltage and current were selected 1 kV and 0.3 A, respectively. A transparent film was formed on the substrate and its physical properties and behaviour were similar to those of the Example 8. It was found that the amount of hydrogens bonded to the microcrystalline carbon or amorphous carbon tended to decrease with a decrease in the pressure of the atmosphere gas and that the amount of hydrogen tended to decrease with a decrease in the input electric power.

EXAMPLE 10

The Example 9 was repeated in a condition where stainless steel mesh screen was placed between the target 2 and the substrate 5 of the apparatus shown by way of model in FIG. 3 and a dc bias voltage of 200 V was applied. It was found that the film formed in this way had a surface containing smaller amount of end alkyl radicals and tended to readily form the diamond structure than the case without the bias voltage application.

EFFECT OF THE INVENTION

The diamond-like thin film of this invention, having the construction described above, and the method of making the film have advantages which are no less better than those of the diamond-like thin film made by the conventionally used CVD methods and the like, are capable of easily performing the doping process and contribute greatly in terms of application to electronic devices. Referring further to the case of using a dc voltage, there are the following great advantages.

i. The reproducibility is good.
ii. Due to the use of a dc voltage, the power source is inexpensive and its control is easy.
iii. Where a bias voltage is applied to the mesh screen, the use of a dc voltage makes its control easy and also makes it possible to separately control the sputtering section and the mesh screen section.
iv. It is possible to obtain thin films of varying film properties.
v. It is possible to control the spreading of a plasma and produce a more uniform film.

What is claimed is:

1. A method of making a diamond-like thin film within a sputtering apparatus having a metal supporter electrode mounted with a graphite target and an opposite counter electrode mounted with a substrate in a vacuum chamber, comprising the steps of:
   (a) evacuating said vacuum chamber to a pressure of about 13.33 μPa ($1 \times 10^{-7}$ torr);
   (b) introducing a hydrogen gas into said vacuum chamber and maintaining the hydrogen pressure at 0.1333 Pa to 666.5 Pa ($10^{-3}$ torr to 5 torr);
   (c) applying electric power to said opposite metal and counter electrodes and flowing a plate current of a density which is a ratio of a plate current value to an area of graphite target on the metal supporter electrode between 4.52 and 9.05 mA/cm$^2$, to produce a hydrogen plasma including an excited hydrogen and hydrogen ion which impinge on said graphite target and produce plasma seeds composed of half-bonded carbons and hydrogens; and (d) depositing said plasma seeds on the substrate and forming said diamond-like film composed of an accumulation of polycrystal diamond particles of 5 nm to 400 nm size enclosed with alkyl radicals whose carbon number is 3 or less.

2. A method of making a diamond-like thin film according to claim 1, wherein said electric power is generated by a radio frequency power source.

3. A method of making a diamond-like thin film according to claim 1, wherein said electric power is generated by a dc power source.

4. A method of making a diamond-like thin film according to claim 1 wherein nitrogen is added to a hydrogen gas to produce a p-type semiconductor diamond thin film.

5. A method of making a diamond-like thin film according to claim 1, wherein said substrate is maintained less than 100° C.

6. A method of making a diamond-like thin film according to claim 1, wherein a mesh screen is provided between said graphite target and said substrate, and a bias voltage less than a voltage of said electric power is applied to said mesh screen.

7. A method of making a diamond-like thin film according to claim 1, wherein said hydrogen includes argon.

8. A method of making a diamond-like thin film according to claim 7, wherein a volume ratio of said hydrogen to said argon is 1:1.

* * * * *